(12) United States Patent
Gallhauser et al.

(10) Patent No.: US 10,782,331 B2
(45) Date of Patent: Sep. 22, 2020

(54) POWER MEASUREMENT APPARATUS

(71) Applicant: Rohde & Schwarz GmbH & Co. KG, Munich (DE)

(72) Inventors: Markus Gallhauser, Freising (DE); Christian Benisch, Augsburg (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 177 days.

(21) Appl. No.: 16/014,074

(22) Filed: Jun. 21, 2018

(65) Prior Publication Data
US 2019/0391194 A1    Dec. 26, 2019

(51) Int. Cl.
*G01R 29/08*    (2006.01)
*H01Q 3/26*    (2006.01)
*H01Q 21/22*    (2006.01)

(52) U.S. Cl.
CPC ............ *G01R 29/08* (2013.01); *H01Q 3/267* (2013.01); *H01Q 21/22* (2013.01)

(58) Field of Classification Search
CPC ........ H01Q 3/267; H01Q 1/243; H01Q 21/22; H01Q 21/24; H01Q 3/24; H01Q 3/26; H01Q 3/28; H01Q 3/40; H01Q 9/045; H04B 17/318; H04B 7/0617; H04B 17/102; H04B 5/0037; H04B 7/0404; H04B 7/0695; H04B 7/082; H04B 17/103; H04B 17/11; H04B 17/12; H04B 17/15; H04B 17/21; H04B 17/29; H04B 7/04; G01R 19/04; G01R 21/10; G01R 21/14; G01R 23/00; G01R 29/0878; G01R 15/142; G01R 19/2513; G01R 22/063; G01R 29/08; G01R 29/0814; G01R 29/105; G01R 27/28; G01R 29/0821; G01R 29/0871; G01R 29/0892; G01R 31/2824
See application file for complete search history.

(56) References Cited

U.S. PATENT DOCUMENTS

| | | | | |
|---|---|---|---|---|
| 3,098,971 | A * | 7/1963 | Richardson | H04B 1/1607 455/19 |
| 5,777,561 | A * | 7/1998 | Chieu | G06K 7/10039 340/10.32 |
| 9,153,691 | B1 * | 10/2015 | Dutta | H01L 29/0692 |
| 10,411,813 | B2 * | 9/2019 | Pauly | H01Q 21/24 |
| 2005/0272392 | A1 * | 12/2005 | Richardson | H01Q 3/267 455/272 |

* cited by examiner

*Primary Examiner* — Vinh P Nguyen
(74) *Attorney, Agent, or Firm* — Christensen O'Connor Johnson Kindness PLLC

(57) ABSTRACT

A test setup for power measurement of a fast switching active antenna array with a beam switching time lower than one microsecond is described. The test setup includes at least two detector modules for detecting a signal transmitted by the fast switching active antenna array and a power sensor module for measuring the power of at least one signal received. The power sensor module has an analog-to-digital converter circuit for converting an analog signal into a digital signal. Each of the detector modules includes at least one antenna via which at least one signal transmitted by the fast switching active antenna array is received. The at least two detector modules are positioned in at least two predefined main radiation directions of the fast switching active antenna array. Each of the detector modules has a rise time, the rise time being lower than the beam switching time of the fast switching active antenna array.

18 Claims, 2 Drawing Sheets

POWER MEASUREMENT APPARATUS

FIELD OF THE DISCLOSURE

Embodiments of the present disclosure relate generally to a test setup for power measurement of a fast switching active antenna array with a beam switching time lower than 1 microsecond.

BACKGROUND

Nowadays, an over-the-air (OTA) power meter setup, also called over-the-air (OTA) power measurement setup, is used for testing the characteristics of a device under test. The OTA power meter setup comprises at least one power sensor module and at least one antenna module for receiving a respective test signal to be forwarded to the at least one power sensor module.

New telecommunication standards require higher carrier frequencies and higher signal bandwidths of the respective signals in order to achieve the high data rates intended. Thus, phased antenna arrays are used in wireless devices and base stations so as to generate the respective wideband signals. These antenna arrays typically use beamforming, also called beam steering or rather beam switching, to control the direction of radiation of the transmitting antenna, thus maximizing the power level at the respective receiver.

The test setups are used to calibrate the output power of the antenna array, namely the one of a device under test, and to test the beamforming function of the antenna array.

Meanwhile, fast switching active antenna arrays with a beam switching time lower than 1 µs are known which cannot be tested by the conventional antenna modules as they have rise/fall times of about 2 µs. Thus, the antenna modules are too slow for the switching times of the fast switching active antenna arrays having beam switching times lower than 1 µs.

Therefore, the wideband signals generated by fast switching active antenna arrays with beam switching time lower than 1 µs are measured by spectrum analyzers being connected to an antenna for receiving the respective signal. The several spectrum analyzers are synchronized with each other so that a beam steering or rather beam switching can be tested appropriately. For instance, beam steering or rather beam steering of two base stations (simulated) is measured.

However, the synchronization of the several spectrum analyzers is complicated so that the whole test system is prone to failure. Moreover, the costs are quite high due to the fact that several spectrum analyzers have to be used which are expensive.

Accordingly, there is a need for a test setup that is capable of power measuring a signal provided by a fast switching active antenna array in an easy and cost-efficient manner.

SUMMARY

Embodiments of the present disclosure provide a test setup for power measurement of a fast switching active antenna array with a beam switching time lower than one microsecond, comprising:

at least two detector modules for detecting a signal transmitted by the fast switching active antenna array; and a power sensor module for measuring the power of at least one signal received, the power sensor module having an analog-to-digital converter circuit for converting an analog signal into a digital signal;

each of the detector modules comprising at least one antenna via which at least one signal transmitted by the fast switching active antenna array is received;

the at least two detector modules being positioned in at least two predefined main radiation directions of the fast switching active antenna array;

each of the detector modules having a rise time, the rise time being lower than the beam switching time of the fast switching active antenna array.

Accordingly, a cost-efficient test setup for measuring the power of signals transmitted by the fast switching active antenna array is provided wherein the fast switching active antenna array has a beam switching time lower than 1 µs. The test setup is cost-efficient since the at least two detector modules are used instead of expensive spectrum analyzers. The detector modules do not have an evaluation circuit so that they are not capable of measuring the power of the signals received. In fact, the detector modules are configured to detect a signal and to forward the signal to the power sensor module.

Moreover, the detector modules can be positioned easily at desired locations that are assigned to the at least two predefined main radiation directions of the fast switching active antenna array so that the signals relating to the main lobes of the radiation pattern at these locations can be detected by the respective detector module appropriately. Thus, a mobile and cost-efficient test setup is provided which can be easily adapted with regard to the measurement characteristics since the detector modules are positioned at the respective locations.

It is not necessary to use two or more spectrum analyzers with an antenna for detecting the respective signals transmitted by the fast switching active antenna array. Since each of the detector modules has a rise time being lower than the beam switching time, the detector modules are fast enough for processing the signals emitted by the fast switching active antenna array.

Generally, the rise time corresponds to the processing time of a signal to change from a specified low value to a specified high value. In digital and measurement technologies, rise time and fall time are the times that a level change of a (ideally) rectangular signal actually requires to change its signal level between two defined intermediate values (for instance 10% and 90%). In fact, the rise time corresponds to a measure of the ability of the test setup to respond to fast input signals such as fast changing signals provided by the fast switching active antenna array.

The detector modules may have an envelope detector circuit having a capacitor that stores up charge on the rising edge of the detector module, for example its envelope detector circuit, and releases the charge stored slowly through a resistor when the signal falls.

In other words, the rise time is lower than 1 microsecond. Since the fast switching active antenna array has a beam switching time lower than 1 µs, the rise time of the respective detector module is also lower than 1 µs. This ensures that the different beam steering signals can be detected and processed by the respective detector module. The different beam steering signals correspond to the signals related to the beam switching of the fast switching active antenna array.

In some embodiments, the rise time may be lower than 500 nanoseconds. Thus, it is ensured that the fast changing signals of the fast switching active antenna array can be detected and processed easily by the detector modules.

According to an aspect, the at least two detector modules are connected with the power sensor module. Thus, the signals received by the at least two detector modules are forwarded to the power sensor module so that the power of the respective signal can be determined. A cost-efficient test setup is provided.

Another aspect provides that each of the detector modules comprises at least one detector diode circuit. The detector diode circuit corresponds to a simple form of an envelope detector circuit as it comprises a detector diode between the input and output of the respective circuit, the detector diode being connected to a resistor and a capacitor. Hence, a low cost envelope detector circuit is provided since the detector diode circuit only requires the use of a few low cost components.

For instance, the at least one detector diode circuit is loaded by less than 10 kOhm. This load inter alia ensures that the detector module can have the respective rise time being lower than the beam switching time of the fast switching active antenna array.

Furthermore, the at least one power sensor module may be configured to synchronize different measured beam steering power signals transmitted by the fast switching active antenna array. The power sensor module may synchronize the respective signals internally. Hence, the respective signals of the fast switching active antenna array, namely the different beam steering power signals measured, are forwarded to the power sensor module for evaluation.

For instance, the at least one power sensor module is configured to synchronize the different measured beam steering power signals by means of the analog-to-digital converter circuit. Thus, the signals forwarded to the power sensor module may be sampled by the analog-to-digital converter circuit so that the respective signals are synchronized.

The at least one power sensor module may comprise several analog-to-digital converters (being part of the analog-to-digital converter circuit) wherein the several analog-to-digital converters are synchronized with each other. The synchronization of the several analog-to-digital converters may be inter alia ensured by using the same sample rate. In addition, a trigger line or rather a synchronization line forwarding a clock signal may be used for synchronizing purposes.

Moreover, the at least one power sensor module may have two or more inputs each being configured to be connected with one of the at least two detector modules. Thus, the signals received by the at least two detector modules may be forwarded to the single power sensor module having the respective inputs.

According to another embodiment, a plurality of power sensor modules may be provided. Thus, the number of signals measured and taken into account can be increased appropriately.

For instance, the plurality of power sensor modules are synchronized with each other by means of their analog-to-digital converter circuits and a synchronization line. The (external) synchronization line may correspond to a trigger line as a synchronization, trigger or rather clock signal is submitted via the respective line. In fact, the sampling performed by the analog-to-digital converter circuits of the different power sensor modules is synchronized.

The number of power sensor modules may correspond to the number of detector modules. Thus, each detector module may be connected to an associated power sensor module. In this embodiment, the respective power sensor modules may have only a single input.

Generally, the test setup may be an over-the-air wideband power meter setup. Thus, wideband radio frequency signals can be transmitted over-the-air and received by the test setup over-the-air. Then, the wideband signals are internally processed by the test setup. Thus, the respective power of the wideband signals can be measured over-the-air.

In some embodiments, the test setup may comprise a fast switching active antenna array. The fast switching active antenna array is part of the test setup.

The fast switching active antenna array may have a beam switching time lower than 1 microsecond. Thus, the active antenna array used for testing purposes may correspond to an active antenna array fulfilling the requirements of new telecommunication standards such as the New Radio (NR) telecommunication standard.

In some embodiments, the fast switching active antenna array has a beam switching time lower than 500 nanoseconds.

The fast switching active antenna array may correspond to a device under test that is tested by the test setup appropriately, for example the at least two detector modules as well as the power sensor module.

Further, the fast switching active antenna array may be part of the device under test.

In some embodiments, the device under test can be a wireless device such as a user end device or a base station.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
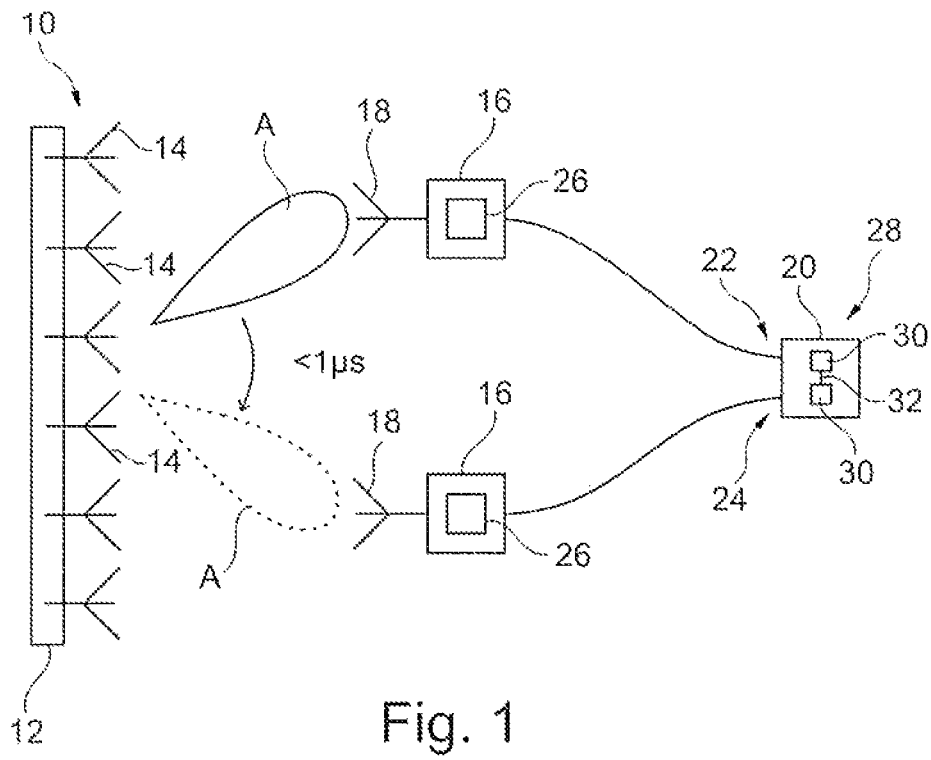
FIG. 1 shows an example of a test setup according to one or more aspects of the present disclosure.

FIG. 1 shows a test setup 10 for power measurement of a fast switching active antenna array 12 that comprises several antennas 14. The fast switching active antenna array 12 may comprise or at least be assigned to a control unit that controls the several antennas 14 for beam steering purposes so that the main radiation direction of the active antenna array 12 can be varied as indicated in FIG. 1 by the illustrated main lobes A of the radiation pattern. Therefore, the active antenna array 12 has a beam steering time, also called beam switching time, that is needed to vary the main radiation direction of the antenna array 12. In some embodiments, beamforming, also called beam steering or rather beam switching, is used by the active antenna array 12 to maximize the power level at the respective receiver so as to ensure the high data rates required by new telecommunication standards.

In FIG. 1, it is also indicated that the main radiation direction can be varied by the fast switching active antenna array 12 within a time lower than 1 microsecond.

In some embodiments, the test setup 10 comprises at least two detector modules 16 each having an antenna 18. The signals transmitted by the fast switching active antenna array 12 can be received by the antennas 18 over-the-air. Thus, the test setup 10 is an over-the-air test setup (OTA setup). Both detector modules 16 are connected to a single power sensor module 20 that has two inputs 22, 24 for being connected with the detector modules 16 appropriately. Accordingly, the detector modules 16 are separately formed with respect to the at least one sensor module 20. Hence, the detector modules 16 as well as the at least one sensor module 20 may have their own housings.

The detector modules 16 are connected with the power sensor module 20 via a cable connection so that the detector modules 16 can be placed at desired locations with respect to the active antenna array 12. Therefore, the detector modules 16 are movable with respect to the at least one sensor module 20 as they are formed separately. In other words, a flexible connection is provided between the detector modules 16 and the power sensor module 20 resulting in a maximum flexibility at low costs. Via the cable connection, the signals processed by the detector modules 16 are forwarded to the power sensor module 20 for measuring the power of the respective signals received.

As shown in FIG. 1, the detector modules 16 are positioned at different locations that correspond to locations at which the main radiation direction of the fast switching active antenna array 12 is pointing, namely the respective main lobes A. Thus, the detector modules 16 can measure the power of the main radiation direction of the fast switching active antenna array 12 at different locations.

For doing so, the at least two detector modules 16 each comprise at least one detector diode circuit 26 corresponding to a simple form of an envelope detector circuit which will be described in more detail later with respect to FIG. 3. The detector diode circuits 26 of the detector modules 16 are loaded each by less than 10 kOhm. This load inter alia ensures that the detector modules 16 have a rise time lower than the beam switching time of the fast switching active antenna array 12, namely lower than 1 μs.

Hence, the rise time of each detector module 16 is lower than the beam switching time so that the respective beam steering signals pointing to different locations subsequently can be detected and processed by the respective detector modules 16 appropriately.

In some embodiments, the power of the beam steering signals, namely the signals transmitted by the active antenna array 12, can be measured in the power sensor module 20. Therefore, the signals received by the detector modules 16, for example via their antennas 18, are forwarded to the at least one power sensor module 20 for measuring the respective power.

In some embodiments, the power sensor module 20 has at least one analog-to-digital converter circuit 28 that is used for converting the analog input signals into digital signals, for instance for power measuring. Furthermore, the analog-to-digital converter circuit 28 may comprise several analog-to-digital converters 30 wherein the A/D-converters 30 are synchronized with each other via an internal synchronization line 32. Thus, the analog-to-digital converters 30 may use the same sampling rate as well as a trigger signal so that they are synchronized appropriately.

Figure 2:
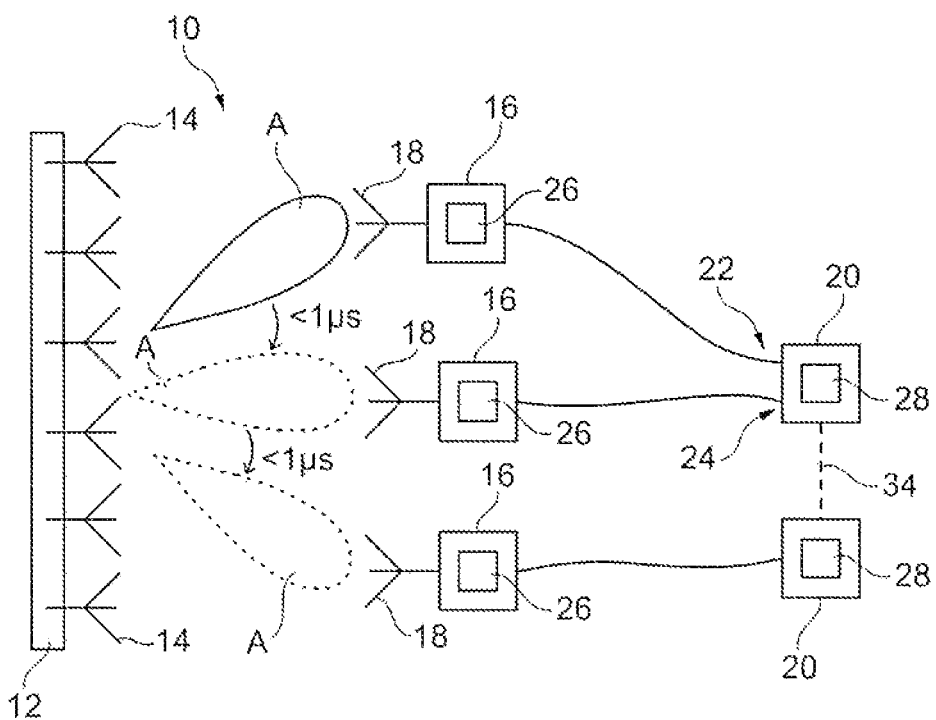
FIG. 2 shows another example of a test setup according to one or more aspects of the present disclosure.

In FIG. 2, another embodiment is shown that comprises two power sensor modules 20. The power sensor modules 20 are each assigned to at least one detector module 16 wherein the respective A/D-converter circuits 28 are synchronized with each other via an external synchronization line 34. The synchronization line 34, also called trigger line, ensures that the respective A/D-converter circuits 28 are synchronized with each other so that the power sensor modules 20 are synchronized with each other. Via the synchronization line 34, a clock signal or rather a sampling signal may be forwarded to the respective A/D-converter circuits 28 so that a synchronization is obtained. For instance, one of the power sensor modules 20 may be a master power sensor module 20 that starts the synchronization appropriately while triggering the next or all other power sensor modules 20 appropriately.

Generally, the test setup 10 shown corresponds to an over-the-air wideband power meter setup since the power of a wideband signal provided by the fast switching active antenna array 12 can be received and measured over-the-air in a cost-efficient as well as an easy manner.

Figure 3:
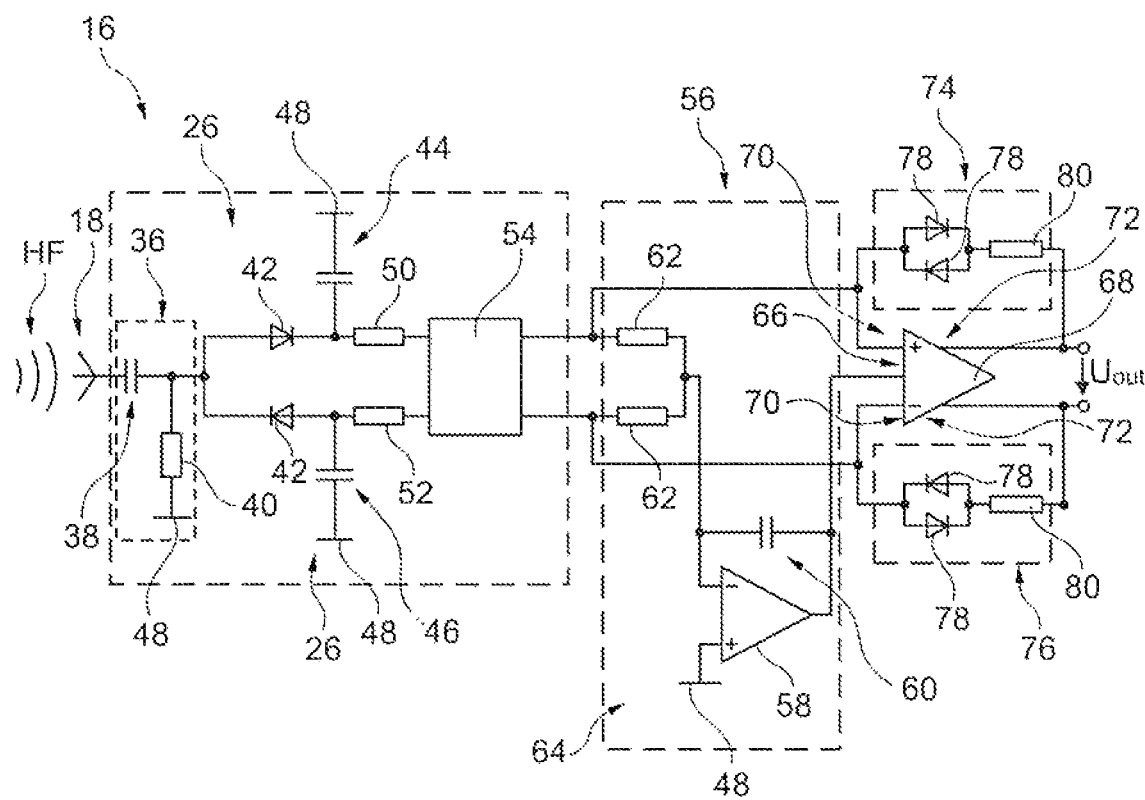
FIG. 3 shows an one representative circuit diagram of a detector module of the test setup according to one or more aspects of the present disclosure.

The detector modules 16 can be established as shown in an exemplary circuit diagram of FIG. 3.

Hence, the detector module 16 receives a high frequency wideband electromagnetic signal HF via its antenna 18. The antenna 18 is connected with a subsequent high-pass filter 36 comprising a capacitor 38 and a resistor 40. The high-pass filter 36 filters the incoming high frequency wideband electromagnetic signals HF wherein the high-pass filter 36 is connected to two detector diode circuits 26 that processes the filtered signal HF.

The detector diode circuits 26 are assigned to the positive half wave of the high-frequency input signal HF and the negative half wave of the high-frequency input signal HF. Therefore, the detector diode circuits 26 each comprise a detector diode 42 that are assigned with different poles to the high-pass filter 36 as shown in FIG. 3.

The other poles of the respective detector diodes 42 are connected each to a charging capacitor 44, 46, of which the respective other pole is connected to a common circuit ground 48. The poles or rather the outputs of the detector diodes 42 assigned to the respective charging capacitors 44, 46 are also connected via a respective resistor 50, 52 with a switch unit 54.

The switch unit 54 interconnects the detector diode circuits 26 with an amplifying circuit 56 wherein the switch unit 54 ensures that one of the two input poles of the amplifying circuit 56 is connected via one of the two resistors 50, 52 to one of the two outputs of the detector diodes 42. Therefore, the switch unit 54 ensures that the respective half wave of the high-frequency input signal HF is forwarded to the amplifying circuit 56. This generally corresponds to a chopper control circuit providing a variable DC output voltage.

The amplifying circuit 56 comprises an operational amplifier 58 and an assigned capacitor 60 which together with resistors 62 provide a symmetrical network 64 which output is connected to a control input 66 of a differential amplifier 68, namely a DC voltage amplifier. In general, the differential amplifier 68 amplifies a differential voltage provided between its two inputs 70 into a differential voltage signal $U_{out}$ between its two outputs 72.

The inputs 70 of the differential amplifier 68 are assigned to negative-feedback circuits 74, 76 which are also connected to the outputs of the switch unit 54. The negative-feedback circuits 74, 76 each comprise two detector diodes 78 which are arranged in an anti-parallel manner relative to each other.

The negative-feedback circuits 74, 76 each comprise a resistor 80 which is connected in series with the respective detector diodes 78 of the respective negative-feedback circuit 74, 76. In general, the respective resistor 80 is used to adjust the value of the negative-feedback so as to compensate the influence of the video resistance.

The detector diodes 78 of the negative-feedback circuits 74, 76 are only used for modelling the characteristics of the detector diodes 42 used in the detector diode circuits 26. Accordingly, the negative-feedback circuits 74, 76 provide a feedback that has a characteristic corresponding to the detector diodes 42 and the resistors 50, 52 used in the detector diode circuits 26.

The specific arrangement of the detector diodes 78 in the negative-feedback circuits 74, 76 takes the change of polarity into account when the switch unit 54 switches between the detector diode circuits 26 as discussed above.

Therefore, the detector modules 16, for example their detector diode circuits 26, each have a rise time being lower than the beam switching time of the active antenna array 12, namely lower than 1 µs or lower than 500 ns.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A test setup for power measurement of a fast switching active antenna array with a beam switching time lower than one microsecond, comprising:
   at least two detectors configured to detect a signal transmitted by the fast switching active antenna array, each of the detectors comprising at least one antenna via which at least one signal transmitted by the fast switching active antenna array is received; and
   a power sensor module configured to measure the power of at least one signal received, the power sensor module having an analog-to-digital converter circuit configured to convert an analog signal into a digital signal;
   wherein the at least two detectors being positioned in at least two predefined main radiation directions of the fast switching active antenna array, each of the detector having a rise time, the rise time being lower than the beam switching time of the fast switching active antenna array;
   the at least two detector modules being separately formed with respect to the at least one power sensor module, but connected with the at least one power sensor module such that the at least two detector modules are movable with respect to the at least one power sensor module; and
   the detector modules being configured to detect a respective signal from the fast switching active antenna array and to forward the respective signal received to the at least one power sensor module so that the power of the signals is determined by the at least one power sensor module.

2. The test setup according to claim 1, wherein the rise time is lower than 1 microsecond.

3. The test setup according to claim 1, wherein the rise time is lower than 500 nanoseconds.

4. The test setup according to claim 1, wherein each of the detectors comprises at least one detector diode circuit.

5. The test setup according to claim 4, wherein the at least one detector diode circuit is loaded by less than 10 kOhm.

6. The test setup according to claim 1, wherein the at least one power sensor module is configured to synchronize different measured beam steering power signals transmitted by the fast switching active antenna array.

7. The test setup according to claim 6, wherein the at least one power sensor module is configured to synchronize the different measured beam steering power signals by the analog-to-digital converter circuit.

8. The test setup according to claim 1, wherein the at least one power sensor module has two or more inputs each being configured to be connected with one of the at least two detectors.

9. The test setup according to claim 1, wherein a plurality of power sensor modules are provided.

10. The test setup according to claim 9, wherein the plurality of power sensor modules are synchronized with each other by their analog-to-digital converter circuits and a synchronization line.

11. The test setup according to claim 9, wherein the number of power sensor modules corresponds to the number of detectors.

12. The test setup according to claim 1, wherein the test setup is an over-the-air wideband power meter setup.

13. The test setup according to claim 1, wherein the test setup comprises a fast switching active antenna array.

14. The test setup according to claim 13, wherein the fast switching active antenna array has a beam switching time lower than 1 microsecond.

15. The test setup according to claim 13, wherein the fast switching active antenna array has a beam switching time lower than 500 nanoseconds.

16. A test setup for power measurement of a fast switching active antenna array with a beam switching time lower than one microsecond, comprising:
   at least two detector modules for detecting a signal transmitted by the fast switching active antenna array; and
   a power sensor module for measuring the power of at least one signal received, the power sensor module having an analog-to-digital converter circuit for converting an analog signal into a digital signal;
   each of the detector modules comprising at least one antenna via which at least one signal transmitted by the fast switching active antenna array is received;
   the at least two detector modules being positioned in at least two predefined main radiation directions of the fast switching active antenna array;
   each of the detector modules having a rise time, the rise time being lower than the beam switching time of the fast switching active antenna array; and
   the at least two detector modules as well as the at least one power sensor module each having a separate housing.

17. The test setup of claim 16, wherein each of the detectors comprises at least one detector diode circuit comprising a diode connected in series with a resistive device having a resistance value less than 10 kOhm.

18. A test setup for power measurement of a fast switching active antenna array with a beam switching time lower than one microsecond, comprising:
- at least two detector modules for detecting a signal transmitted by the fast switching active antenna array; and
- a power sensor module for measuring the power of at least one signal received, the power sensor module having an analog-to-digital converter circuit for converting an analog signal into a digital signal;
- each of the detector modules comprising at least one antenna via which at least one signal transmitted by the fast switching active antenna array is received;
- the at least two detector modules being positioned in at least two predefined main radiation directions of the fast switching active antenna array;
- each of the detector modules having a rise time, the rise time being lower than the beam switching time of the fast switching active antenna array; and
- the at least two detector modules being connected with the at least one sensor module via a cable connection such that a flexible connection is provided between the at least two detector modules and the at least one power sensor module, resulting in a maximum flexibility of the test setup.

* * * * *